United States Patent [19]

Vo

[11] Patent Number: 4,849,710

[45] Date of Patent: Jul. 18, 1989

[54] TEMPERATURE COMPENSATED HIGH GAIN FET AMPLIFIER

[75] Inventor: Howard Q. Vo, San Jose, Calif.

[73] Assignee: Litton Systems, Inc., Beverly Hills, Calif.

[21] Appl. No.: 186,956

[22] Filed: Apr. 27, 1988

[51] Int. Cl.⁴ ............................................. H03F 3/193
[52] U.S. Cl. ..................... 330/277; 330/286; 330/289; 330/293
[58] Field of Search ............... 330/277, 286, 289, 293

[56] References Cited

U.S. PATENT DOCUMENTS

| | | | |
|---|---|---|---|
| 3,517,325 | 6/1970 | Blackmer | 330/277 X |
| 4,207,538 | 6/1980 | Goel | 330/277 |
| 4,223,274 | 9/1980 | Paulke et al. | 330/279 X |
| 4,525,680 | 6/1985 | Pan et al. | 330/277 |
| 4,555,675 | 11/1985 | Blanchandin et al. | 330/277 X |
| 4,578,603 | 3/1986 | McPherson | 330/277 X |
| 4,734,751 | 3/1988 | Hwang et al. | 330/277 X |

OTHER PUBLICATIONS

Amrine et al., "Amplifier", *IBM Technical Disclosure Bulletin*, vol. 11, No. 10, Mar. 1969, p. 1280.

Primary Examiner—James B. Mullins
Attorney, Agent, or Firm—Elliott N. Kramsky

[57] ABSTRACT

An amplifier includes a single-gate FET and a dual gate FET in parallel interconnection. A temperature sensing circuit supplies a temperature-dependent bias voltage to the $G_2$ gain control gate of the dual gate FET to counteract the temperature-dependence of the amplifier FETs thereby providing gain stability in the presence of temperature variations.

7 Claims, 4 Drawing Sheets

TEMPERATURE COMPENSATED HIGH GAIN FET AMPLIFIER

BACKGROUND

1. Field of the Invention

The present invention relates to apparatus for amplifying electrical signals. More particularly, this invention pertains to an improved field effect transistor ("FET") amplifier.

2. Description of the Prior Art

Numerous devices such as receivers for missiles and the like that present extreme space limitations require amplifiers of the wideband solid-state microwave gallium arsenide FET type. In addition to space requirements, such amplifiers must meet difficult-to-attain specifications with regard to small-signal gain, linearity and gain compensation stability as a function of temperature.

One method that has been attempted to achieve a high small-signal gain per stage is disclosed in FIG. 1. As is seen, this involves the connection of identical FET devices 10, 12 in a feedback configuration. While such an arrangement does in fact increase the small-signal gain, it is hampered by the known temperature-dependence of FET gain. That is, the gain of the FET decreases as temperature is increased. This poses a serious design problem and a common solution is to cascade a gain stage with a temperature-varying PIN diode attenuator.

Unfortunately, the use of a PIN diode attenuator is hampered by the (approximately 5 dB) insertion loss of the attenuator which lowers overall amplifier gain. Further, the insertion loss caused by the attenuator tends to worsen the amplifier noise figure and to lower the output power of the temperature-compensated cascade. Finally, the above-mentioned crucial size constraints imposed by various applications are jeopardized by the addition of the attenuator which is often at least as large as the amplifier arrangement.

SUMMARY

The foregoing and other disadvantages of the prior art are addressed and overcome by the present invention that provides a novel FET amplifier. In a first aspect, the amplifier includes a first FET having a gate and a second FET having a switching gate and a gain control gate connected thereto. Means are additionally provided for providing a temperature-dependent bias voltage to the gain control gate.

In another aspect, the amplifier of the invention includes a first FET having a gate and a second FET having a switching gate and a gain control gate. The first FET is connected to the second FET so that the gate of the first FET is in connection with the switching gate of the second FET and the drain of the first FET is in connection with the drain of the second FET. Means are provided for providing a temperature-dependent bias voltage to the gain control gate.

In yet another aspect, the FET amplifier includes a FET having a switching gate and a gain control gate. Means are provided for providing a temperature-dependent bias voltage to the gain control gate.

In still another aspect, the FET amplifier of the invention includes a first FET having a gate and a second FET having a switching gate and a gain control gate. The first FET is connected with the second FET so that the gate of the first FET is in connection with the switching gate of the second FET and the drain of the first FET is in connection with the drain of the second FET.

The preceding and other advantages and features of this invention will become further apparent from the detailed description that follows. This description is accompanied by a set of drawing figures which include corresponding numerals. Like figures refer to like features throughout both the written description and the figures.

DETAILED DESCRIPTION

Figure 1:
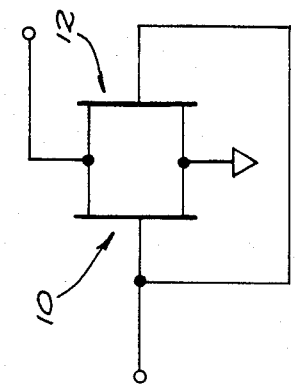
FIG. 1 is a simplified schematic diagram of a FET amplifier in accordance with the prior art.
Figure 2A:
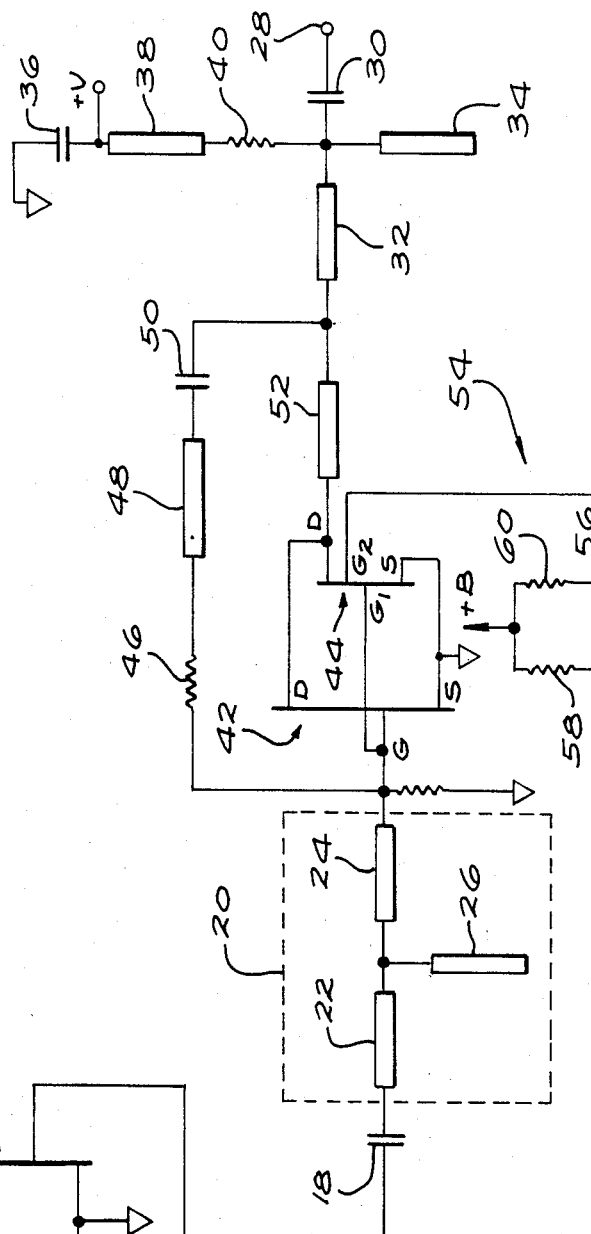
FIG. 2A is a schematic diagram of a first embodiment of a FET amplifier in accordance with the present invention.

Turning now to the drawings, FIG. 2A is a schematic diagram of a high gain microwave FET amplifier in accordance with the invention.

The amplifier accepts r.f. energy input at a port 16 through a blocking capacitor 18 and an input matching network 20 comprising microwave inductor series stubs 22 and 24 and a microwave capacitor open stub 26 and the amplified signal output is provided at a port 28. A blocking capacitor 30 prevents undesired d.c. current flow while a series stub 32 and an open stub 34 form an output matching network. A d.c. voltage of +V is isolated from r.f. energy within the circuit by an r.f. choke formed by the combination of a bypass capacitor 36, a drain line 38 and a drain bias resistor 40 as shown.

The amplifier includes a single gate microwave FET transistor 42 that is connected in parallel with a dual gate microwave FET transistor 44. In an actual embodiment, the single gate FET comprised a TI Model 1350, a gallium arsenide device commercially available from Texas Instruments Corporation of Dallas, Tex., while the dual gate FET comprised a Model MWT-5, also a gallium arsenide device commercially available from Microwave Technology of Fremont, California. The theory and operation of the dual gate FET are discussed, for example, by Stephen A. Maas in "Microwave Mixers" (Artech House, Inc. 1986), pages 80 through 87. Further, and as well known in the art, a dual gate FET may be formed by appropriately connecting a pair of single gate devices.

A network associated with the parallel FET arrangement includes a feedback resistor 46, a microstripline feedback inductor 48 and a blocking capacitor 50. A series drain line 52 is connected to the drains (D) of both of the FET transistors 42 and 44. The use of a feedback arrangement as above-described enhances the bandwidth of the amplifier (0.5–7 GHz in an actual reduction to practice). As is well known in the art, the noise figure of the amplifier may be significantly reduced by the use of a relatively high-resistance (300 ohms, for example) feedback resistor 46 which reduces the r.f. current fed from the drains (D) of the single gate FET 42 and the dual gate FET 44 to the gates (G) of the FET 42 and 44.

As can be seen, the sources (S) and the drains (D) of the FETs 42 and 44 are mutually interconnected as in the prior art arrangement discussed above. Also, the gate (G) of the FET 42 is connected to the r.f. or "switching" gate $G_1$ of the FET 44. The gain control gate $G_2$ of the FET 44 is, however, connected to a temperature sensing circuit 54 that generally comprises a voltage divider formed of resistors 58, 60, 62 and 64 and including a bipolar PNP transistor 56.

Figure 2B:
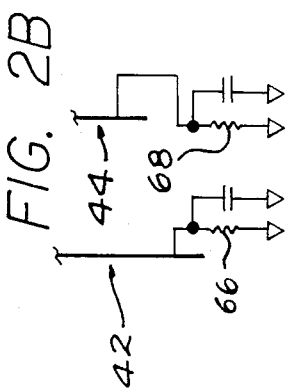
FIG. 2B is a schematic diagram of a modification of the prior embodiment in accordance with the invention.
Figure 5:
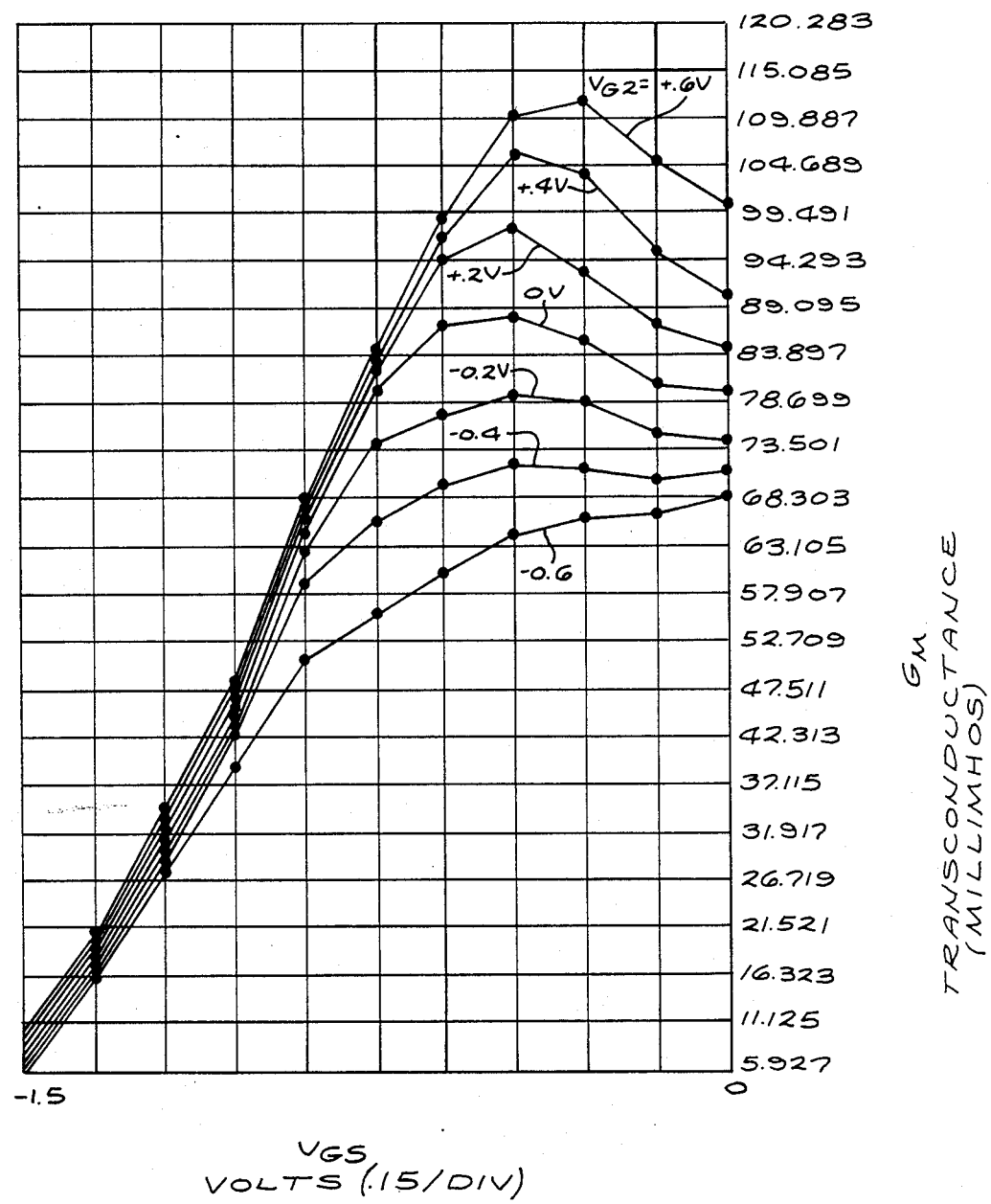
FIG. 5 is a graph of a series of transconductance curves (transconductance versus gate-to-source voltage), each curve being associated with a different gain control gate voltage level, for a high gain FET amplifier in accordance with the invention.

In the event that one is interested solely in temperature compensation and is not concerned with reducing second harmonic distortion (discussed below) then the source of the single gate FET 42 need not be connected to that of the dual gate FET 44. In that case, the gate-to-source voltages of the FETs 42 and 44 may not be the same and it may not be possible to add their transconductances as shown in FIG. 5 to derive an almost-constant $G_M$ curve, Therefore, second harmonic distortion may or may not be reduced. Such an alternative arangement is shown in FIG. 2B wherein the embodiment of FIG. 2A is modified by "breaking" the former connection between sources. In such a circuit, a source resistor 66 is employed to self-bias the drain-to-source current in the single gate FET 42 while a source resistor 68 serves to self-bias the dual gate FET 44.

The circuit 54 provides a compensating (increased or decreased) bias voltage to the dual gate FET 44 in response to a change in ambient temperature. In general, the circuit 54 is arranged to produce a voltage change that adjusts the gain of the FET 44 by an amount and in a direction opposite to the change in the combined gains of the FETs 42 and 44 that would otherwise occur in response to that temperature change. For example, when the ambient temperature increases, the collector or second gate voltage of the bipolar transistor 56 increases.

A fixed d.c. voltage of $+B$ is supplied to the top of the voltage divider circuit. In doing so, a fixed d.c. voltage of $+V_B$ is set up at the base of the transistor 56 as shown. Since emitter voltage is equal to the base voltage plus the emitter-to-base voltage, and since the emitter-to-base voltage decreases with an increase in temperature the emitter voltage of the transistor 56 decreases with an increase in temperature. As a consequence, the voltage drop across the resistor 60 increases, causing the flow of current through the resistor 60 to increase. This increase in the emitter current will cause an increase in the collector current. Since there is negligible current flowing into the second gate of the FET 44, the increased collector current effectively flows across the resistor 64 causing the collector voltage to increase. Since the collector is tied to the gate $G_2$ of the dual gate FET 44, the bias voltage applied to the FET 44 increases which, in turn, increases the gain of the FET 44. As an increase in temperature would otherwise decrease the gain of the FET 44, the voltage change provided by the circuit 54 counteracts the temperature-dependence of the gain of not only the FET 44 but also that of the FET 42. Further, the circuit 54 does not introduce the undesirable insertion losses that have hampered prior art attempts to compensate for temperature that have included PIN diode attenuators. Nor does the arrangement suffer from the significant increase in size which occurs when a PIN diode module is combined with a parallel FET amplifier.

Figure 3:
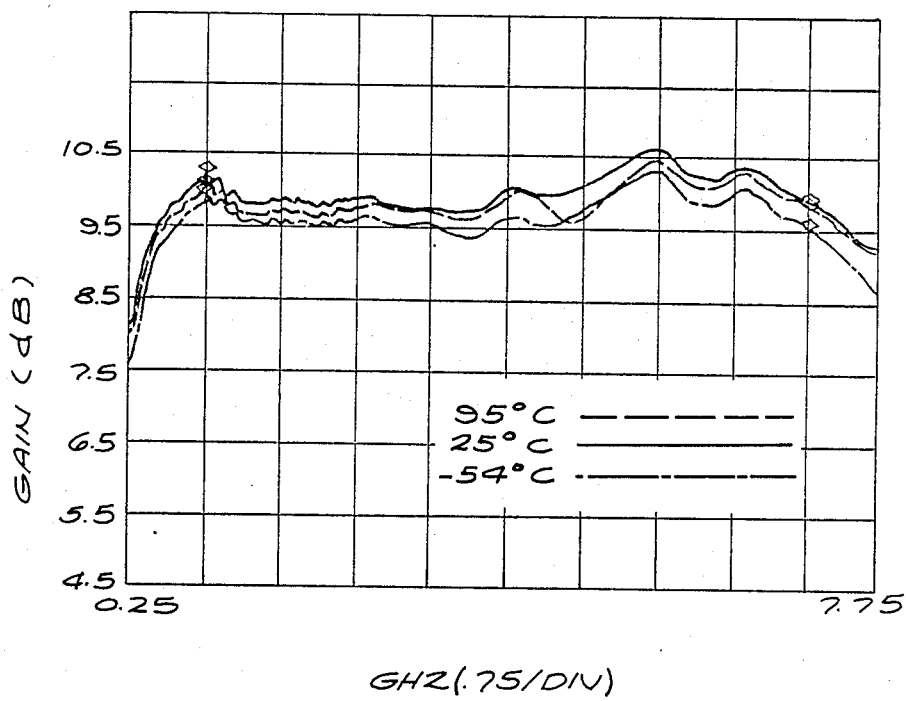
FIG. 3 is a graph of small-signal gain as a function of temperature for a FET amplifier in accordance with the invention.

FIG. 3 is a graph of small-signal gain as a function of temperature for a FET amplifier in accordance with the invention. The amplifier circuit employed a single-gate FET TGF-1350 and a dual gate FET MWT-5 arranged as shown in the preceding schematic. The curves of FIG. 3 were generated by operating the circuit over a range of $-54$ degrees to $+95$ degrees Centigrade while recording gain versus temperature as shown. As can be seen, the curves are relatively linear and "flat" over the relevant range, indicating that the amplifier is well-compensated over this temperature range. In contrast to the present invention, feedback amplifiers using two low-noise, single-gate FETs in parallel are commonly observed to exhibit a gain variation versus temperature of about 0.007 dB/degree Centigrade/gain stage. Over a temperature range of $-54$ degrees to $+95$ degrees Centigrade, a difference of 149 degrees Centigrade, this significant coefficient will cause a variation in the frequently-undesirable amount of about 1 dB, a level which, as noted on the graph of FIG. 3 is greater than the variation of an amplifier in accordance with the invention.

Figure 4A:
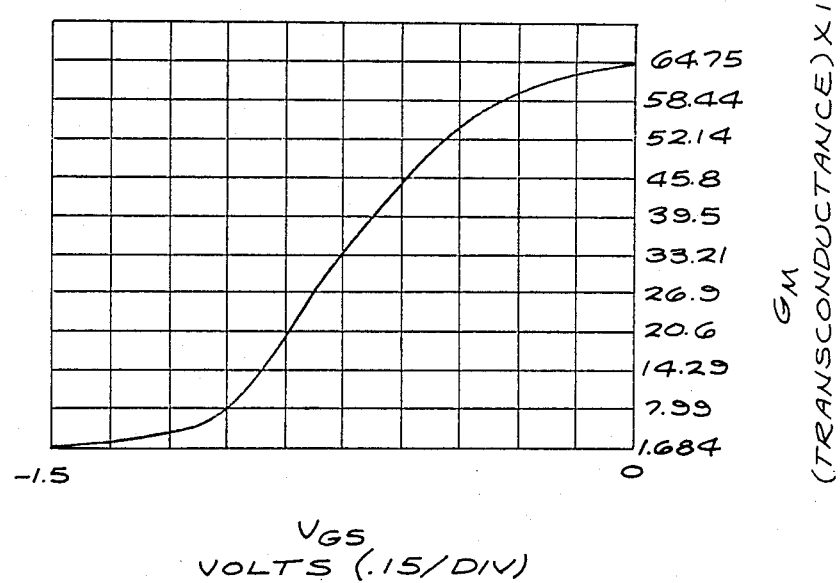
FIG. 4a is a graph of the transconductance characteristic of a single gate FET (transconductance versus gate-to-source voltage)
Figure 4B:
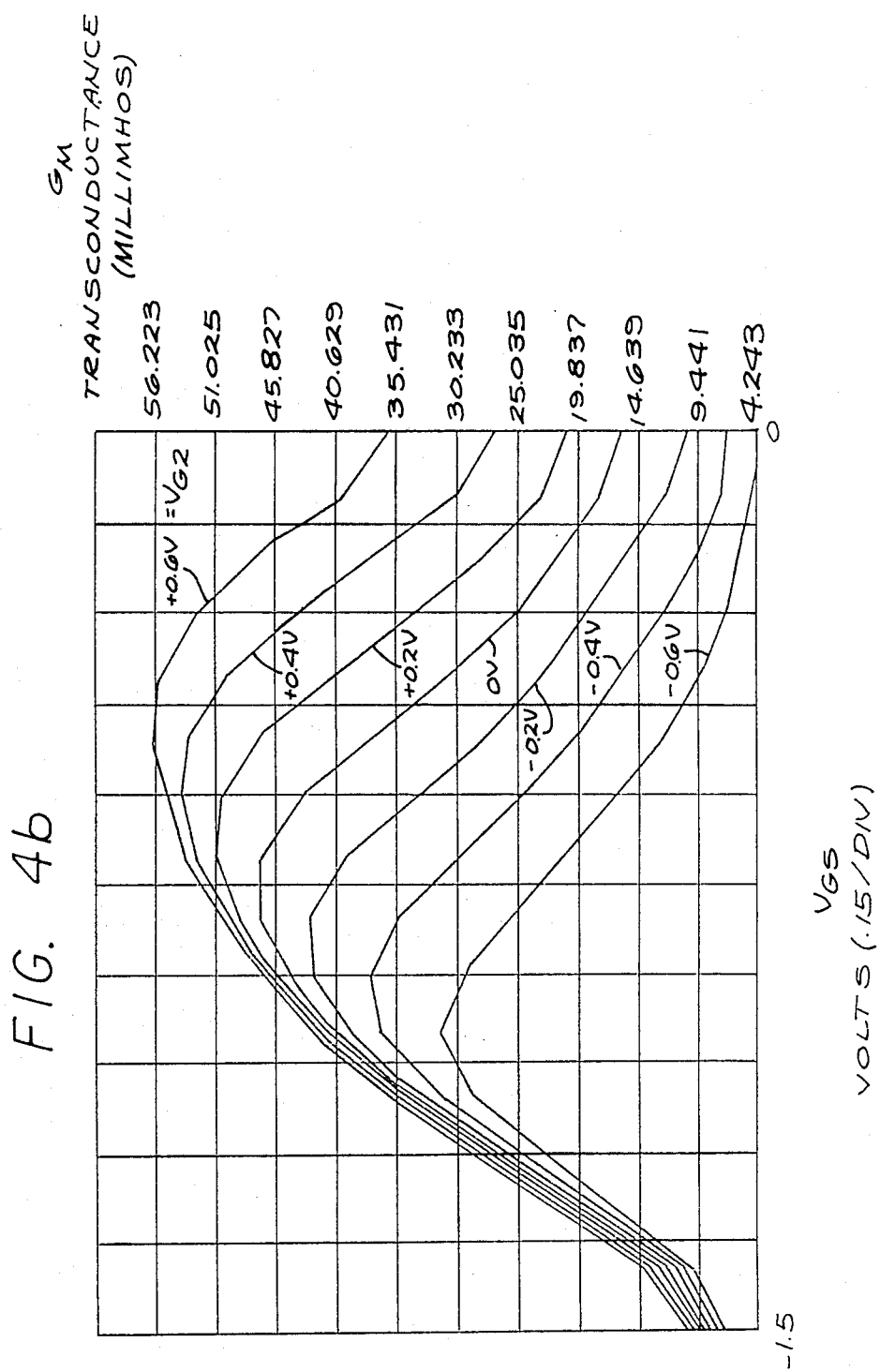
FIG. 4b is a graph of a series of transconductance curves for a dual gate FET (transconductance versus gate-to-source voltage), each curve being associated with a different gain control gate voltage level.

FIGS. 4a and 4b are graphs of curves of the transconductance characteristic of a single and a dual gate FET respectively. As can be noted, the curve of the transconductance $G_M$ versus gate-to-source voltage $V_{GS}$ of FIG. 4a for a single-gate FET exhibits a positive slope. On the other hand, each of the series of curves (each curve corresponding to a different voltage level $V_{G2}$ applied to the gain control gate of the dual-gate FET) of FIG. 4b for a dual-gate FET exhibits a negative slope in the region of interest (i.e. the region of the curve in which $V_{GS}$ ranges from zero volts to the voltage at which the transconductance $G_M$ of the dual gate FET reaches a maximum value for a given value of second gate voltage $V_{G2}$. The opposite slopes of the two curves permit one to design the parallel FET amplifier by selecting and biasing the single gate and the dual gate FETs so that the slope of their transconductance characteristics are of equal magnitude and opposite polarities. As a consequence the two transconductances, which are additive in the configuration of the invention, yield a nearly constant value thereof about the quiescent point in the region of interest of the amplifier. This resultant characteristic is shown in FIG. 5 which presents a graph of the transconductance curves or characteristics of an amplifier in accordance with the invention.

The substantially-constant transconductance of a FET amplifier in accordance with the invention provides highly desirable reduction in second harmonic distortion. Such distortion is defined as the undesired portion of the output signal that occurs at twice the input frequency. In many feedback amplifiers with greater-than-one octave bandwidths, such distortion falls within the operational bandwidth and cannot be filtered out. Such distortion results principally from the non-constant value of FET transconductance as the input signal level is varied so that the output power remains in the linear region where the output is not compressed (i.e. where any increase in input power (dBm) will yield the same increase in output power (dBm)).

Thus it is seen that the present invention provides a novel and improved FET amplifier. By utilizing the teachings of the invention one is able to attain the enhanced gain of a two stage cascade amplifier without encountering many of the disadvantages of prior art devices. For example, by utilizing a temperature sensing circuit to provide a d.c. voltage which compensates for the change in gain of the FET component devices, one is able to overcome the temperature-dependence of prior art amplifiers without a PIN diode, thereby avoiding the numerous problems attendant with the insertion loss caused by such a device. By avoiding the use of a PIN diode, the invention achieves greater compactness than the above-described prior art arrangement. The invention may be employed within a balanced amplifier. The amplifier is amenable to fabrication on a single chip. Furthermore, this device can be embedded in a monolithic microwave chip.

While this invention has been disclosed with reference to a presently-preferred embodiment, it is by no means limited thereto. For example, while the invention has been described with reference to an amplifier that includes FETs of gallium arsenide fabrication for use with microwave range frequencies, the invention is also intended to include amplifiers that employ silicon FET devices and the like for use in association with lower frequency signals. Additionally, a single dual-gate FET or two dual gate FETs in parallel may form an amplifier to be provided with temperature compensation in accordance with the present invention. Alternatively, the advantages of reduced second harmonic distortion may be realized by the combination of a single gate FET and a dual-gate FET connected in accordance with the invention (FIG. 2A) without employing temperature compensation means. As such, the invention is only limited insofar as defined in the following set of claims and includes all equivalents thereof.

What is claimed is:

1. A FET amplifier comprising, in combination:
   (a) a first FET having a single gate;
   (b) a second FET connected to said first FET, said second FET having a switching gate and a gain control gate, said first FET and said second FET being arranged into a single amplifier stage and having transconductance characteristics of opposite slopes in a predetermined operating region;
   (c) the gate of said first FET being connected to the switching gate of said second FET, the drain of said first FET being connected to the drain of said second FET and the source of said first FET being in connection with the source of said second FET;
   (d) means for providing a temperature-dependent bias voltage to said gain control gate, said bias voltage being determined in accordance with, and in opposition to, the temperature-dependence of the gain of said combination of said first and said second FETs.

2. A FET amplifier as defined in claim 1 further characterized in that said means for providing a temperature-dependent bias voltage additionally comprises a voltage divider including a bipolar transistor.

3. A FET amplifier as defined in claim 2 wherein said first and second FETs are microwave FETs.

4. A FET amplifier comprising, in combination:
   (a) a first FET having a single gate;
   (b) a second FET having a switching gate and a gain control gate, said first FET and said second FET being arranged into a single amplifier stage and having transconductance characteristics of opposite slopes in a predetermined operating region;
   (c) said first FET being connected to said second FET so that the gate of the first FET forming a junction with the switching gate of the second FET and the drain of the first FET forming a junction with the drain of the second FET and the source of said first FET being in connection with the source of said second FET; and
   (d) means for providing a temperature-dependent bias voltage to said gain control gate, said voltage being determined in accordance with and in opposite to the temperature dependence of the gain of said combination of said first and said second FETS.

5. A FET amplifier as defined in claim 4 further characterized in that said means for providing a temperature-dependent bias voltage additionally comprises a voltage divider including a bipolar transistor.

6. A FET amplifier as defined in claim 5 further characterized in that a feedback resistor is located between the junction of the gate of said first FET and the switching gate of said second FET and the junction of the drain of said first FET and the drain of said second FET.

7. A FET amplifier as defined in claim 6 wherein said first FET and said second FET are microwave FETs.

* * * * *